United States Patent
Watanabe

(10) Patent No.: US 12,041,811 B2
(45) Date of Patent: Jul. 16, 2024

(54) DISPLAY DEVICE WITH A CURVED PORTION FOR IMPROVED REALIABILITY

(71) Applicant: SHARP KABUSHIKI KAISHA, Sakai (JP)

(72) Inventor: Noriko Watanabe, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 558 days.

(21) Appl. No.: 17/273,121

(22) PCT Filed: Sep. 26, 2018

(86) PCT No.: PCT/JP2018/035589
§ 371 (c)(1),
(2) Date: Mar. 3, 2021

(87) PCT Pub. No.: WO2020/065750
PCT Pub. Date: Apr. 2, 2020

(65) Prior Publication Data
US 2022/0052292 A1    Feb. 17, 2022

(51) Int. Cl.
| | |
|---|---|
| *H10K 50/824* | (2023.01) |
| *H10K 50/816* | (2023.01) |
| *H10K 50/844* | (2023.01) |
| *H10K 59/12* | (2023.01) |
| *H10K 59/122* | (2023.01) |
| *H10K 59/124* | (2023.01) |
| *H10K 59/131* | (2023.01) |
| *H10K 59/65* | (2023.01) |
| *H10K 71/00* | (2023.01) |

(52) U.S. Cl.
CPC ....... *H10K 50/844* (2023.02); *H10K 59/1315* (2023.02); *H10K 59/65* (2023.02); *H10K 71/00* (2023.02); *H10K 59/1201* (2023.02)

(58) Field of Classification Search
CPC .. H10K 50/844; H10K 59/65; H10K 59/1315; H10K 59/1201; H10K 71/00
USPC ..................................... 257/40, 59
See application file for complete search history.

(56) References Cited

U.S. PATENT DOCUMENTS

| | | | |
|---|---|---|---|
| 11,751,422 B2* | 9/2023 | Watanabe ........... | H01L 27/1244 257/71 |
| 2015/0311409 A1* | 10/2015 | Huang ................. | G02F 1/1333 257/99 |
| 2016/0284267 A1* | 9/2016 | Gil ........................ | H01L 27/124 |
| 2016/0307971 A1* | 10/2016 | Jeon ..................... | G09G 3/3233 |
| 2018/0070461 A1* | 3/2018 | Lee ...................... | G09G 3/3225 |
| 2018/0204901 A1* | 7/2018 | Hwang ................ | H10K 59/123 |

(Continued)

FOREIGN PATENT DOCUMENTS

WO       2014/126662 A1       8/2014

*Primary Examiner* — Eric W Jones
(74) *Attorney, Agent, or Firm* — ScienBiziP, P.C.

(57) ABSTRACT

A display device includes a display region, a frame region, and a curved portion. The display device includes a resin layer, a plurality of inorganic insulating films, and a metal layer. A metal pattern formed with the metal layer is formed between an edge portion of the curved portion and the display region in the frame region along a curved shape of the edge portion of the curved portion and along at least a portion of corresponding two sides of the display device. The metal pattern is electrically disconnected from a wiring line of the display region, and a width of the metal pattern decreases toward both end portions.

14 Claims, 16 Drawing Sheets

(56) References Cited

U.S. PATENT DOCUMENTS

2018/0233552 A1* 8/2018 Lee ........................ H10K 50/84
2019/0165309 A1* 5/2019 Kim ................... H10K 50/8426
2019/0304366 A1* 10/2019 Ka ...................... G02F 1/13452

* cited by examiner

DISPLAY DEVICE WITH A CURVED PORTION FOR IMPROVED REALIABILITY

TECHNICAL FIELD

The present disclosure relates to a display device and a method for manufacturing a display device.

BACKGROUND ART

PTL 1 describes a display device including a notched portion (also referred to as a notch portion) for installing a camera or the like.

CITATION LIST

Patent Literature

PTL 1: WO 2014/126662 A1 (published Aug. 21, 2014)

SUMMARY

Technical Problem

However, there are the following problems in the display device described in PTL 1 including the notched portion for installing a camera or the like, and a curved portion having a curved shape and disposed at a corner portion at which two sides of an outer shape portion intersect each other.

FIG. 16 is an explanatory view of a manufacturing step of a display device 105 of the related art including a curved portion and problems of the display device 105 of the related art.

As illustrated in (a) of FIG. 16, a display device 101 subjected to singulation includes a display panel 102, a first film 103 provided in a surface of one side of the display panel 102, and a second film 104 provided in a surface of the other side of the display panel 102. Then, as illustrated in (a) of FIG. 16, an outer shape of the display device 101 subjected to singulation is fully cut, for example, by laser light.

An outer shape portion (a non-main region) fully cut from the display device 101 subjected to singulation is removed, and the first film 103 is peeled, and thus the display device 105 including a curved portion C in each of an outer diameter portion and a notched portion K1 illustrated in (b) of FIG. 16 can be obtained.

As illustrated in (a) and (b) of FIG. 16, the display device 101 includes a plurality of the curved portions C in the outer shape portion and the notched portion K1. In these curved portions C, laser light easily concentrates at curved corners, and thus a small crack (or scratch) is generated in partition processing. In addition, when the display device 101 subjected to singulation warps, stress easily concentrates in the curved portions C, and thus a small crack (or scratch) is generated.

As illustrated in (b) of FIG. 16, and (c) of FIG. 16 that is a partially-enlarged view of the curved portion C, at a place at which a small crack (or scratch) is generated, film stress is released in a direction in which curvature increases, and such a crack extends in a film stress releasing direction and becomes a large crack, and there is a possibility that the reliability of the display device 105 decrease.

The disclosure has been made in view of the above-described problems, and an object of the disclosure is to provide a display device having improved reliability while including a curved portion having a curved shape in an outer shape portion, and a method for manufacturing a display device.

Solution to Problem

To solve the problems described above, a display device of the disclosure is a display device including a display region, a frame region disposed in a periphery of the display region, and a curved portion having a curved shape and provided at a corner portion at which two sides intersect each other in an outer shape portion of the frame region, wherein the display device includes a resin layer, a plurality of inorganic insulating films formed on the resin layer, and a metal layer formed on and being in contact with one inorganic insulating film of the plurality of inorganic insulating films, a metal pattern formed with the metal layer is formed between an edge portion of the curved portion and the display region in the frame region along a curved shape of the edge portion of the curved portion and along at least a portion of corresponding two sides of the display device, and the metal pattern is electrically disconnected from a wiring line of the display region, and a width of the metal pattern decreases toward both end portions.

To solve the problems described above, a method for manufacturing a display device of the disclosure is a method for manufacturing a display device including a display region, a frame region disposed in a periphery of the display region, and a curved portion having a curved shape and provided at a corner portion at which two sides intersect each other in two sides of the frame region, the method including the steps of forming a resin layer, forming a plurality of inorganic insulating films on the resin layer, forming a metal layer formed on and being in contact with one inorganic insulating film of the plurality of inorganic insulating films, and forming a metal pattern by patterning the metal layer between an edge portion of the curved portion and the display region in the frame region along a curved shape of the edge portion of the curved portion and along at least a portion of corresponding two sides of the display device, wherein the metal pattern is electrically disconnected from a wiring line of the display region and is formed having a width of the metal pattern decreasing toward both end portions.

Advantageous Effects of Disclosure

According to an aspect of the disclosure, a display device having improved reliability while including a curved portion having a curved shape in an outer shape portion, and a method for manufacturing a display device can be provided.

DESCRIPTION OF EMBODIMENTS

Embodiments of the disclosure will be described below with reference to FIGS. 1 to 9. Hereinafter, for convenience of description, a configuration including the same function as a function of a configuration described in a specific embodiment is denoted by the same reference sign, and description of the configuration may be omitted.

Note that in each embodiment described below, the case where a display device includes an organic light emitting diode (OLED) will be described as an example of a display device, but the embodiment is not limited to this case, and the display device may include an inorganic light emitting diode or a quantum dot light emitting diode (QLED), and a type of the display device is not particularly limited as long as the display device has flexibility and includes a notched portion (notch portion).

First Embodiment

Hereinafter, a display device 1 of a first embodiment of the disclosure will be described with reference to FIGS. 1 to 7.

Figure 1:
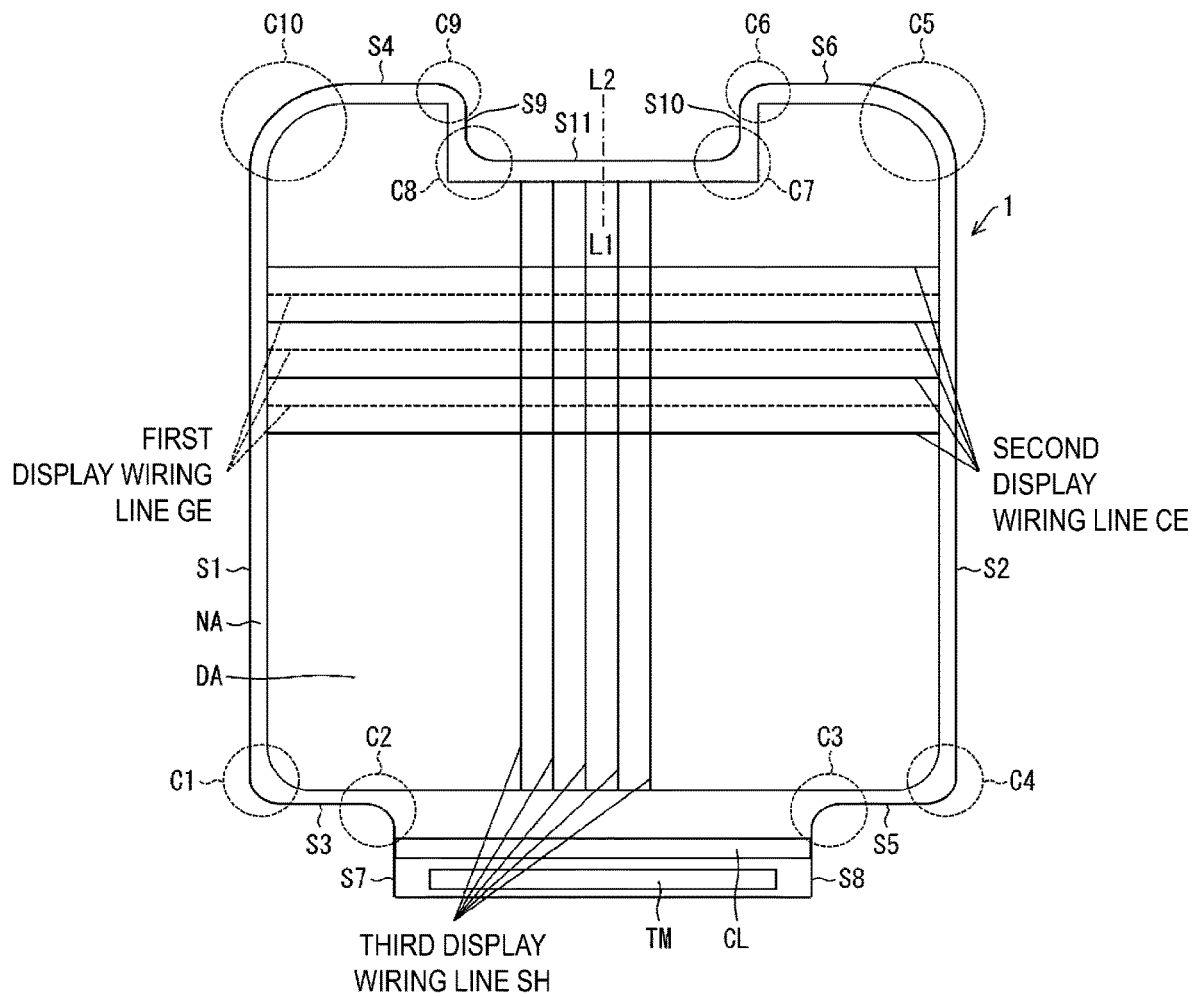
FIG. 1 is a plan view of a display device of a first embodiment.
Figure 2:
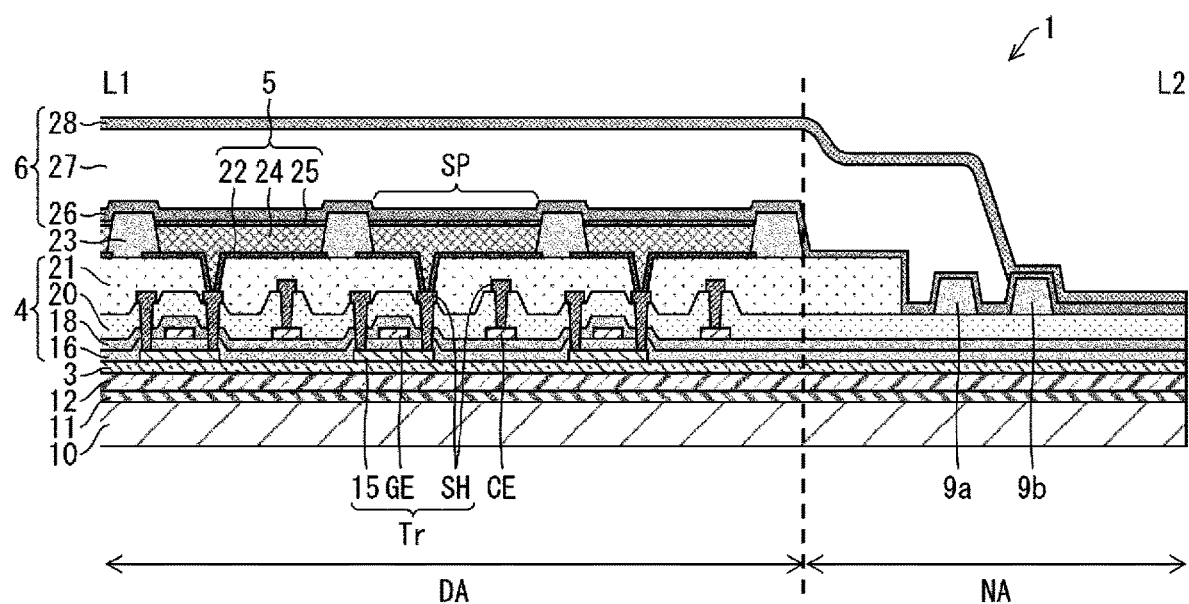
FIG. 2 is a cross-sectional view taken along line L1-L2 illustrated in FIG. 1.
Figure 3:
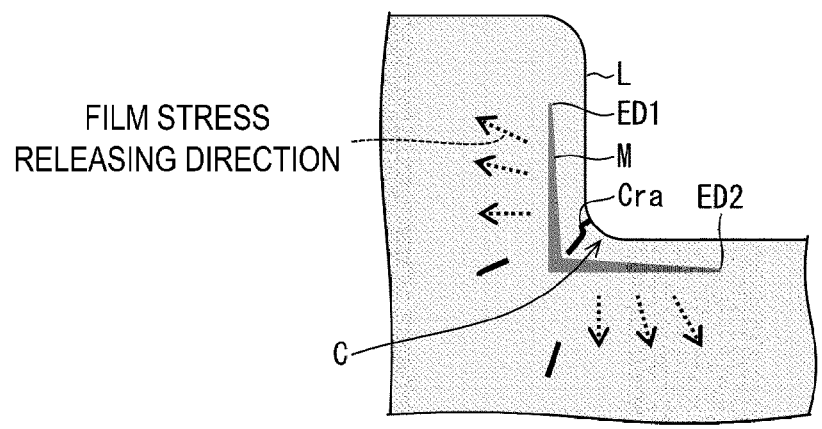
FIG. 3 is a partially-enlarged view of a curved portion in a notched portion illustrated in FIG. 1.

FIG. 1 is a plan view of the display device 1, and FIG. 2 is a cross-sectional view taken along line L1-L2 illustrated in FIG. 1. FIG. 3 is a partially-enlarged view of a curved portion C in a notched portion illustrated in FIG. 1.

As illustrated in FIGS. 1 and 2, the display device 1 includes a display region DA and a frame region NA disposed in a periphery of the display region DA. In addition, the display device 1 includes the curved portion C having a curved shape and provided at each of a plurality of corner portions at which two sides intersect each other in an outer shape portion of the frame region NA. In an outer shape of the frame region NA, a curved portion C1 is formed at a corner portion at which a side S1 and a side S3 intersect each other, a curved portion C2 is formed at a corner portion at which the side S3 and a side S7 intersect each other, a curved portion C3 is formed at a corner portion at which a side S8 and a side S5 intersect each other, a curved portion C4 is formed at a corner portion at which the side S5 and a side S2 intersect each other, a curved portion C5 is formed at a corner portion at which the side S2 and a side S6 intersect each other, a curved portion C6 is formed at a corner portion at which the side S6 and a side S10 intersect each other, a curved portion C7 is formed at a corner portion at which the side S10 and a side S11 intersect each other, a curved portion C8 is formed at a corner portion at which the side S11 and a side S9 intersect each other, a curved portion C9 is formed at a corner portion at which the side S9 and a side S4 intersect each other, and a curved portion C10 is formed at a corner portion at which the side S4 and the side S1 intersect each other.

The display device 1 is obtained, for example, by fully cutting an outer shape subjected to singulation, by laser light. Note that although not illustrated in FIG. 1, the frame region NA of the display device 1 includes lead wiring lines TW1 to TWn that are electrically connected to terminal portions TM1 to TMm (see FIG. 12).

As illustrated in FIG. 3, a metal pattern M formed with a metal layer is formed between an edge portion L (outer shape portion) of the frame region NA of the display device 1 and the display region DA along a curved shape of the curved portion C and along at least a portion of corresponding two sides of the outer shape of the display device 1. Note that the metal pattern M is electrically disconnected from a wiring line and the like from the display region DA described below. Note that the metal pattern M and a wiring line and the like from the display region DA are electrically disconnected to interrupt influence of a metal pattern M1 on a wiring line and the like of the display region DA.

As illustrated in FIG. 2, in the display region DA of the display device 1, a base substrate 10 is bonded to a lower face of a resin layer 12 via an adhesive layer 11. On the other hand, in an upper face of the resin layer 12, a base coat film 3 that is an inorganic film, a TFT layer 4, an organic EL element layer 5, and a sealing layer 6 are formed.

An example of a material of the base substrate 10 can include polyethylene terephthalate (PET), but the material is not limited to this.

Examples of the adhesive layer 11 can include an optical clear adhesive (OCA) or an optical clear resin (OCR), but the adhesive layer 11 is not limited to this.

Examples of a material of the resin layer 12 can include a polyimide resin, an epoxy resin, and a polyamide resin, but the material is not limited to this.

The base coat film 3 is a layer that prevents moisture or an impurity from entering the TFT layer 4 or the organic EL element layer 5, and the base coat film 3 can include, for example, a silicon oxide film, a silicon nitride film, or a silicon oxynitride film that is formed by CVD, or a layered film of these films.

The TFT layer 4 is provided in an upper layer of the resin layer 12 and the base coat film 3. The TFT layer 4 includes a semiconductor film 15, a gate insulating film 16 formed in an upper layer overlying the semiconductor film 15, a first display wiring line GE including a gate electrode and formed in an upper layer overlying the gate insulating film 16, a first inorganic insulating film 18 formed in an upper layer overlying the first display wiring line GE, a second display wiring line CE formed in an upper layer overlying the first inorganic insulating film 18, a second inorganic insulating film 20 formed in an upper layer overlying the second display wiring line CE, a third display wiring line SH including source and drain electrodes and formed in an upper layer overlying the second inorganic insulating film 20, and an interlayer insulating film 21 formed in an upper layer overlying the third display wiring line SH.

Note that a capacitance element includes a capacitance electrode provided in the second display wiring line CE formed right on the first inorganic insulating film 18, the first inorganic insulating film 18, and a capacitance counter electrode formed right under the first inorganic insulating film 18 and overlapping the capacitance electrode in the same layer as a layer forming the first display wiring line GE.

A thin film transistor element (TFT) Tr as an active element is constituted and includes the semiconductor film 15, the gate insulating film 16, the first display wiring line GE, the first inorganic insulating film 18, the second inorganic insulating film 20, and the third display wiring line SH.

The semiconductor film 15 includes low-temperature polysilicon (LTPS) or an oxide semiconductor, for example.

For example, each of the first display wiring line GE, the second display wiring line CE, and the third display wiring line SH includes a single layer film or a layered film of a metal including at least one of aluminum (Al), tungsten (W), molybdenum (Mo), tantalum (Ta), chromium (Cr), titanium (Ti), copper (Cu), and silver (Ag).

For example, each of the gate insulating film 16, the first inorganic insulating film 18, and the second inorganic insulating film 20 can include a silicon oxide (SiOx) film, a silicon nitride (SiNx) film, or a silicon oxynitride film that is formed by CVD, or a layered film of these films.

The interlayer insulating film 21 can include, for example, a coatable photosensitive organic material such as a polyimide resin and an acrylic resin.

The organic EL element layer 5 includes an anode 22 formed in an upper layer overlying the interlayer insulating film 21, a bank 23 that covers an edge of the anode 22, an electroluminescence (EL) layer 24 formed in an upper layer overlying the anode 22, and a cathode 25 formed in an upper layer overlying the EL layer 24. The organic EL element layer 5 includes the anode 22, the EL layer 24, and the cathode 25 in an island shape for each subpixel SP. The bank (anode edge cover) 23 can include a coatable photosensitive organic material such as a polyimide resin and an acrylic resin, for example. The organic EL element layer 5 forms the display region DA and is provided in an upper layer of the TFT layer 4.

Note that the organic EL element layer 5 is not limited to the configuration described above and may be constituted by layering the cathode, the light-emitting layer, and the anode from the substrate side.

For example, the EL layer 24 is constituted by layering a hole injection layer, a hole transport layer, a light-emitting layer, an electron transport layer, and an electron injection layer in order from the lower layer side. The light-emitting layer is formed in an island shape for each subpixel by vapor deposition or an ink-jet method, but other layers can also be a solid-like common layer. In addition, a configuration where one or more layers of the hole injection layer, the hole transport layer, the electron transport layer, and the electron injection layer are not formed is also possible.

The anode (anode electrode) 22 is constituted by, for example, layering Indium Tin Oxide (ITO) and an alloy including Ag, and the anode 22 has light reflectivity. The cathode 25 can include a transparent conductive material such as Indium Tin Oxide (ITO) and Indium Zinc Oxide (IZO).

In the organic EL element layer 5, a hole and an electron are recombined inside the EL layer 24 by a drive current between the anode 22 and the cathode 25, and an excitor thus generated falls into a ground state, and thus light is emitted. Since the cathode 25 is transparent and the anode 22 has light reflectivity, light emitted from the EL layer 24 is emitted upward and top-emitting is realized.

The sealing layer 6 is transparent, and includes a first inorganic sealing film 26 that covers the cathode 25, an organic sealing film 27 formed in an upper side overlying the first inorganic sealing film 26, and a second inorganic sealing film 28 that covers the organic sealing film 27. The sealing layer 6 covering the organic EL element layer 5 prevents foreign matters such as water and oxygen from infiltrating the organic EL element layer 5.

Each of the first inorganic sealing film 26 and the second inorganic sealing film 28 can include, for example, a silicon oxide film, a silicon nitride film, or a silicon oxynitride film that is formed by CVD, or a layered film of these films. The organic sealing film 27 is thicker than each of the first inorganic sealing film 26 and the second inorganic sealing film 28, and is a transparent organic film, and can include a coatable photosensitive organic material such as a polyimide resin and an acrylic resin.

In the frame region NA of the display device 1 illustrated in FIG. 2, a first frame-shaped bank (a first projection) 9a surrounding the display region DA in a frame shape, and a second frame-shaped bank (second projection) 9b surrounding the first frame-shaped bank 9a in a frame shape are provided on the second inorganic insulating film 20.

At the step of forming the organic sealing film 27 inside the sealing layer 6, the first frame-shaped bank 9a and the second frame-shaped bank 9b regulate wet-spreading of a liquid organic material when the liquid organic material is applied to at least an entire surface of the display region DA.

In the case of the display device 1 illustrated in FIG. 2, the organic sealing film 27 is formed to an inclined side face in the left side of the second frame-shaped bank 9b. Thus, outside the inclined side face in the left side of the second frame-shaped bank 9b, the first inorganic sealing film 26 and the second inorganic sealing film 28 that are inorganic films are in direct contact with each other, and form a sealing layer.

The first frame-shaped bank 9a and the second frame-shaped bank 9b can include, for example, a coatable photosensitive organic material such as polyimide, and acrylic. In addition, the first frame-shaped bank 9a and the second frame-shaped bank 9b may be formed by using the same material as the material of the bank (anode edge cover) 23.

A method for manufacturing the display device 1 includes each of the following steps. Specifically, the method includes the steps of forming the resin layer 12, forming the base coat film 3, the gate insulating film 16, the first inorganic insulating film 18, and the second inorganic insulating film 20 on the resin layer 12, forming a metal layer formed on and being in contact with one inorganic insulating film of a plurality of the inorganic insulating films, and forming the metal pattern M by patterning the metal layer between the edge portion L of the curved portion C of the display device 1 and the display region DA in the frame region NA along a shape of at least a portion of the edge portion L of the curved portion C.

In this way, the display device 1 includes the resin layer 12, the plurality of inorganic insulating films formed on the resin layer 12, and the metal layer formed on and being in contact with one inorganic insulating film of the plurality of inorganic insulating films.

Note that although FIG. 2 illustrates a top gate of the display device 1, the disclosure is also applicable to a bottom gate of the display device 1.

Figure 4:
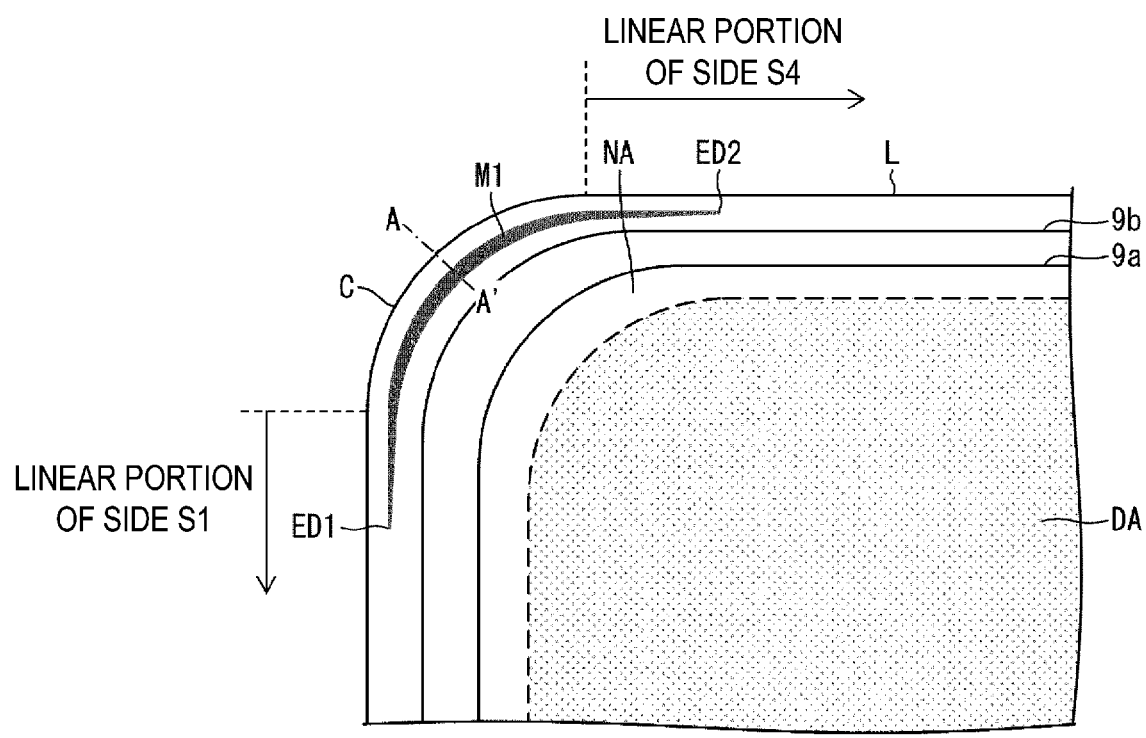
FIG. 4 is a partially-enlarged view of a curved portion at a corner portion of an outer shape portion illustrated in FIG. 1.

FIG. 4 is a partially-enlarged view of the curved portion C provided at a corner portion at which two sides intersect each other in the edge portion L of the frame region NA. As illustrated in FIG. 4, a surface of an inorganic layered film including the base coat film 3, the gate insulating film 16, the first inorganic insulating film 18, and the second inorganic insulating film 20 is covered with a flattening film 31. The flattening film 31 is a resin layer and is formed with, for example, a polyimide resin, an epoxy resin, a polyamide resin, or the like.

The gate insulating film 16, the first inorganic insulating film 18, and the second inorganic insulating film 20 provided in the plurality of inorganic insulating films of the display device 1 are layered in that order. As illustrated in FIG. 1, a plurality of the first display wiring lines GE, a plurality of the second display wiring lines CE, and a plurality of the third display wiring lines SH are formed in the display region DA. The first display wiring lines GE are formed between the gate insulating film 16 and the first inorganic insulating film 18. The second display wiring lines CE are formed between the first inorganic insulating film 18 and the second inorganic insulating film 20. The third display wiring lines SH are formed between the second inorganic insulating film 20 and the flattening film 31.

For example, as illustrated in FIG. 1, the first display wiring lines GE are a plurality of scanning signal lines extending in parallel to the x direction in the display region and are a plurality of light emission control lines.

For example, as illustrated in FIG. 1, the second display wiring lines CE are a plurality of initialization power source lines extending in parallel to the x direction in the display region and are a plurality of high power supply voltage lines.

For example, as illustrated in FIG. 1, the third display wiring lines SH are a plurality of data signal lines extending in parallel to the y direction in the display region and are a plurality of high power supply voltage lines.

Note that, to decrease wiring line resistance and reduce a vertical and horizontal difference in a decrease of power supply voltage (IR drop), the high power supply voltage lines are disposed with wiring line layers changed in the x direction and the y direction as described above.

In the display region, pixel circuits are disposed in a matrix shape in correspondence to intersections between a plurality of data signal lines S(m) and a plurality of scanning signal lines G(n).

Figure 5:
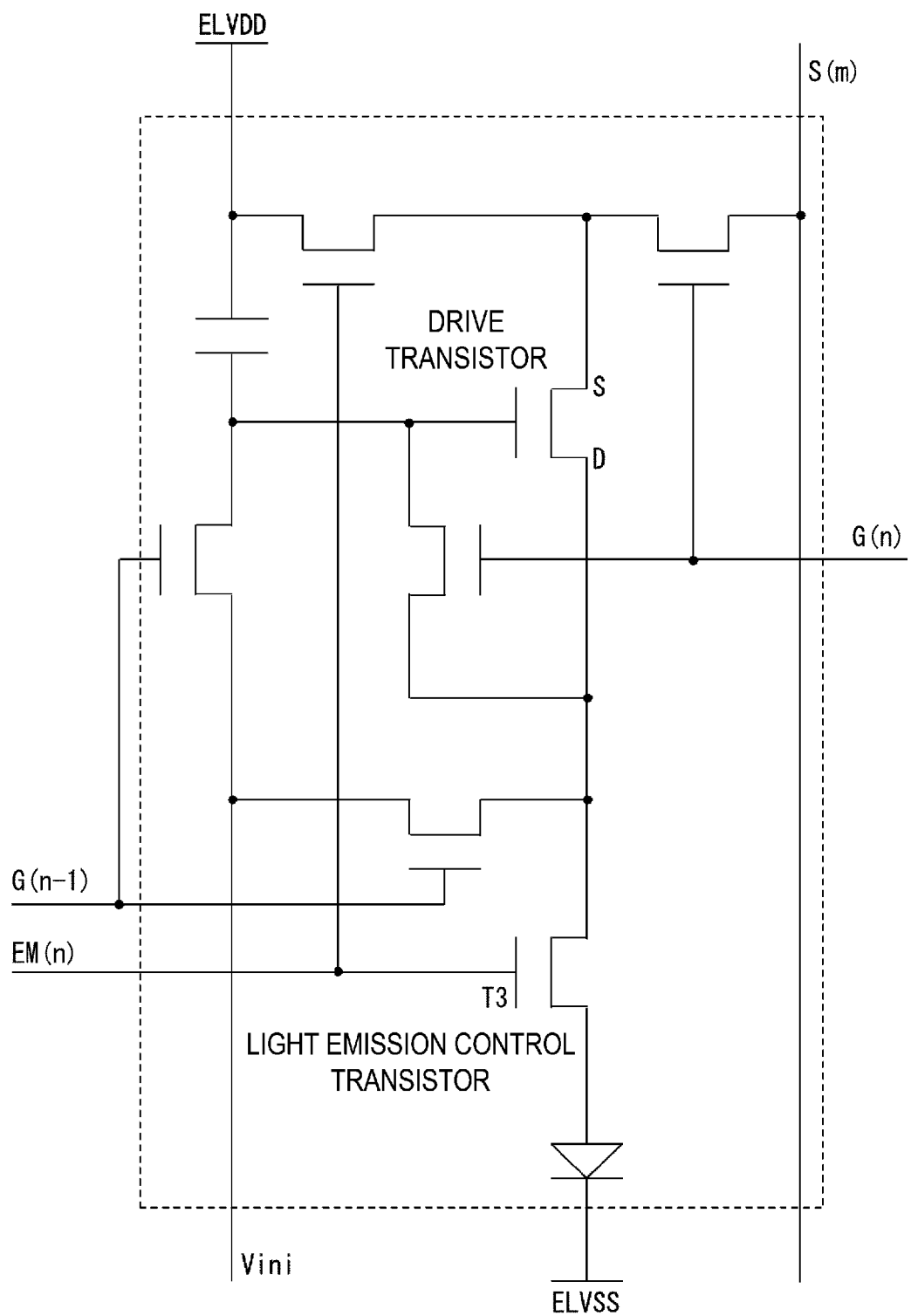
FIG. 5 is a diagram illustrating a configuration of a pixel circuit of a display device.

Next, a configuration of each of the pixel circuits inside the display region will be described. FIG. 5 is a circuit diagram illustrating the configuration of the pixel circuit corresponding to an mth column and an nth row. Note that the configuration of the pixel circuit described here is an example, and other known configurations can also be employed. The pixel circuit illustrated in FIG. 5 includes one organic EL element OLED, seven transistors T1 to T7 (a drive transistor T1, a writing control transistor T2, a power supply control transistor T3, a light emission control transistor T4, a threshold voltage compensation transistor T5, and initialization transistors T6 and T7), and one capacitor C1. The transistors T1 to T7 are p-channel transistors. The capacitor C1 is a capacitance element including two electrodes. The light emission control lines are connected to control terminals of T3 and T4. The scanning signal lines (n) are connected to control terminals of T2 and T5. The scanning signal lines (n−1) are connected to control terminals of T6 and T7. However, the control terminal of T7 may be connected to the scanning signal lines (n). The initialization power source lines are connected to one of conduction terminals of T6 and T7. The data signal lines are connected to one of conduction terminals of T2. The high power supply voltage lines are connected to one of conduction terminals of T3. The cathode of the organic EL element is electrically connected to a low power supply voltage ELVSS.

However, the pixel circuit described above is an example, and the pixel circuit may include an n-channel transistor.

As illustrated in FIGS. 3 and 4, the curved portion C is formed in a curved shape having a small radius of curvature, and, in a case where a crack Cra is generated in the curved portion C, moisture or the like may infiltrate the display device 1 due to extension of the crack Cra. Thus, to suppress the extension of the crack Cra outside the frame region NA, the metal pattern M is formed between the second frame-shaped bank 9b and the edge portion L of the curved portion C. That is, the metal pattern M is formed outside the first frame-shaped bank 9a and the second frame-shaped bank 9b. Note that a formation position of the metal pattern M is not limited to this, and the metal pattern M may be formed between the second frame-shaped bank 9b and the display region DA. In addition, the metal pattern M may be formed in each of the curved portions C1 to C10 disposed at 10 places illustrated in FIG. 1 or may be formed in any one of the curved portions C1 to C10 or may be formed at a plurality of places.

Figure 6:
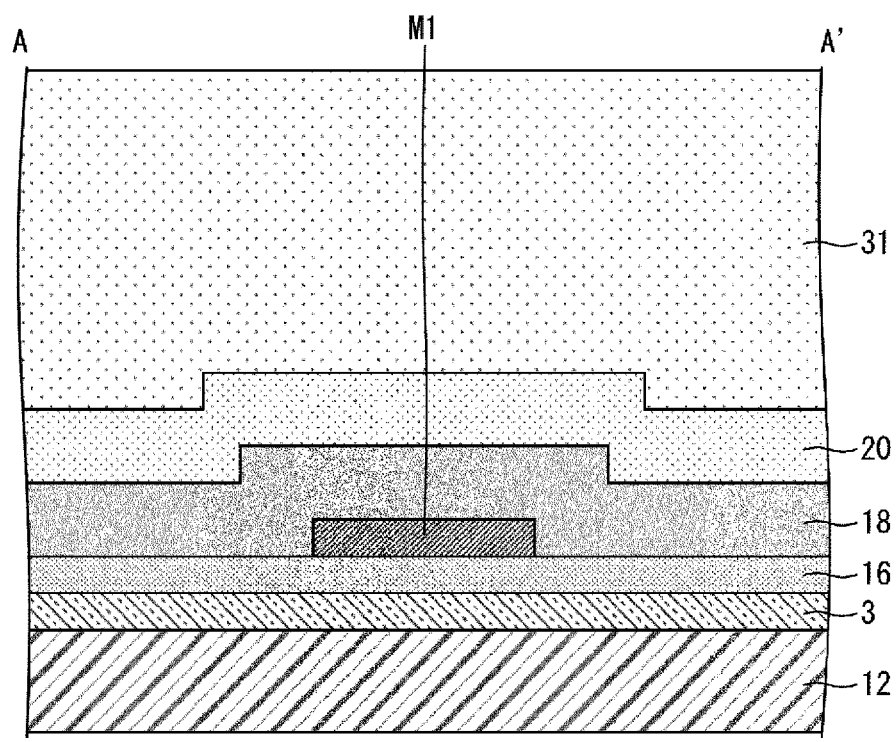
FIG. 6 is a cross-sectional view taken along line A-A' illustrated in FIG. 4.

FIG. 6 is a cross-sectional view taken along line A-A' illustrated in FIG. 4. As illustrated in FIG. 6, a metal pattern M1 is formed right on the gate insulating film 16 in the same layer as the layer forming the first display wiring lines GE provided in the display region DA. That is, the metal pattern M1 is interposed between the gate insulating film 16 and the first inorganic insulating film 18. The metal pattern M1 is formed in the same layer as the layer of the first display wiring lines GE and is formed with the same material as a material of the first display wiring lines GE.

In the display device 1, the crack Cra generated in full cutting by, for example, laser light of the outer shape subjected to singulation is present. In a case where the resin layer 12 expands and contracts due to a change in ambient humidity and temperature of the display device 1, film stress is generated in the display device 1 due to the expansion and contraction of the resin layer 12. The metal pattern M1 is provided at or near the edge portion L in the curved portion C of the display device 1. In a case where film stress is generated due to the expansion and contraction of the resin layer 12, the metal pattern M1 suppresses extension in a film stress releasing direction of the crack Cra. Thus, the display device 1 having improved reliability while the edge portion L includes the curved portion C having a curved shape can be provided.

Note that when the inorganic films including the gate insulating film 16, the first inorganic insulating film 18, and the second inorganic insulating film 20 are divided, a minute crack or scratch may be generated in a periphery of the curved portion C, and such a minute crack or scratch tends to easily extend in the film stress releasing direction as the film thickness of each of the inorganic films increases. This tendency can be confirmed not only in the ease of a single-layer inorganic film, but also in the case of an inorganic layered film including a plurality of inorganic films layered one on another. It has been confirmed that, in a case where the film thickness of the single-layer inorganic film or the film thickness of the inorganic layered film including the plurality of inorganic films layered one on another is a thickness of approximately 500 nm or greater, a minute crack (or scratch) tends to significantly extend in the film stress releasing direction. On the other hand, it has been confirmed that, in a case where the film thickness of the single-layer inorganic film or the film thickness of the inorganic layered film including the plurality of inorganic films layered one on another is a thickness of approximately 200 nm or less, a minute crack (or scratch) does not significantly extend in the film stress releasing direction.

Then, in the present embodiment, the metal pattern M1 is formed right on the gate insulating film 16. In this way, in the inorganic layered film including the base coat film 3, the gate insulating film 16, the first inorganic insulating film 18, and the second inorganic insulating film 20, portions divided into an inorganic layered film including the base coat film 3 and the gate insulating film 16, and an inorganic layered film including the first inorganic insulating film 18 and the second inorganic insulating film 20 can be formed. Accordingly, significant extension in the film stress releasing direction of a minute crack (or scratch) due to an increase in the thickness of the inorganic layered film can be suppressed.

Note that in at least any one layer of layers forming the first display wiring lines GE, the second display wiring lines CE, and the third display wiring lines SH, the metal pattern M1 is formed with a metal layer including the same material as a material of each layer.

The metal pattern M1 is formed in a substantially L shape at or near the edge portion L of the curved portion C of the display device 1 along the curved shape of the edge portion L of the curved portion C. Note that the shape of the metal pattern M1 is not limited to a substantially L shape. In this way, the metal pattern M1 is provided at or near the edge portion L in the curved portion C of the display device 1, and thus deformation due to thermal expansion and moisture absorption expansion of the resin layer 12 due to a change in ambient humidity and temperature can be suppressed, and significant extension in the film stress releasing direction of the crack Cra can be suppressed. Thus, the display device 1 having improved reliability while including the curved portion C having a curved shape can be provided.

As an example of the metal pattern M1, in a case where curvature of the curved portion C of the display device 1 is 0.5 mm, the metal pattern M1 can be formed having the width of the metal pattern M1 of 0.07 mm, and the total length of the metal pattern M1 of 2 mm. The width and the total length of the metal pattern M1 can be determined appropriately in accordance with the curvature of the curved portion C. Preferably, the metal pattern M1 is formed having the width of the metal pattern M1 equal to or greater than 30 µm, and the total length of the metal pattern M1 equal to or greater than twice the curvature of the curved portion C.

As illustrated in FIG. 3 and FIG. 4, the metal pattern M includes each of end portions ED1 and ED2 in a linear portion of each side at a corner portion at which two sides of the outer shape portion intersect each other. In addition, the metal pattern M is formed having the width decreasing toward the end portion ED1 and the end portion ED2.

At or near both the end portions ED1 and ED2 of the metal pattern M, a crack may be generated in the inorganic film due to a difference in a coefficient of thermal expansion between a portion including the metal pattern M and a portion including no metal pattern M. For this reason, preferably, the metal pattern M is separate by about 100 µm from the edge portion L of the display device 1. However, when the metal pattern M is disposed at a position separate from the edge portion of the display device 1, it becomes difficult to prepare a display device having a small width of the frame region NA to that extent.

Thus, the metal pattern M is formed having the width decreasing toward each of both the end portions ED1 and ED2. Accordingly, influence on the inorganic film due to a difference in a coefficient of thermal expansion at or near both the end portions ED1 and ED2 of the metal pattern M can be reduced, and generation of a crack in the inorganic film at or near both the end portions ED1 and ED2 of the metal pattern M can be suppressed.

Modified Example

Figure 7:
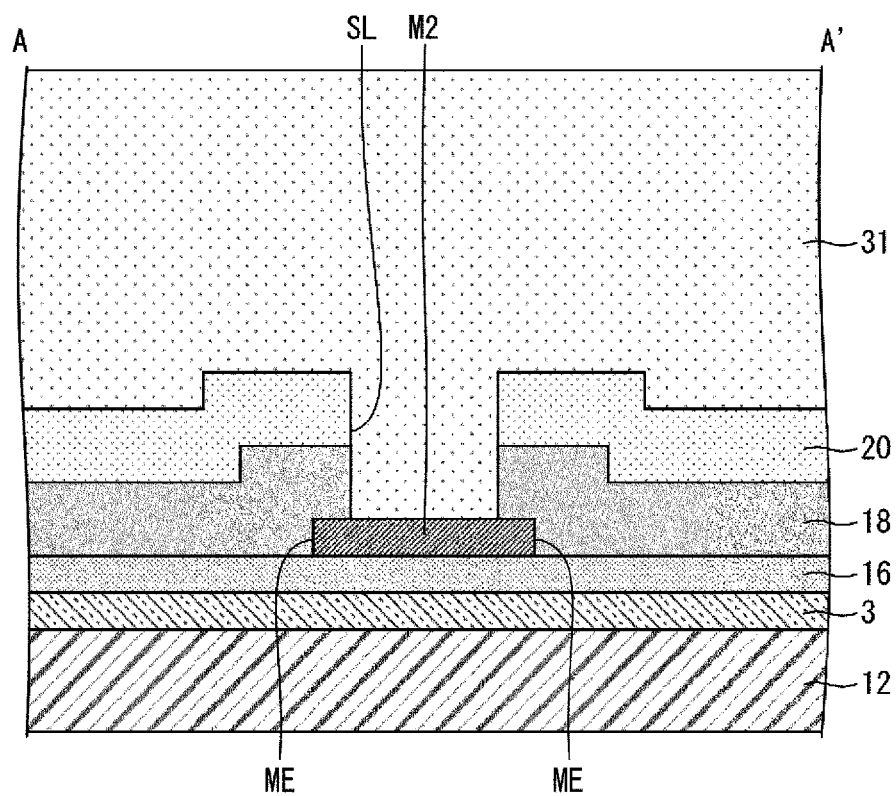
FIG. 7 is a cross-sectional view illustrating a schematic configuration of a frame region disposed in a periphery of a curved portion in a display device of a modified example of the first embodiment.
Figure 8:
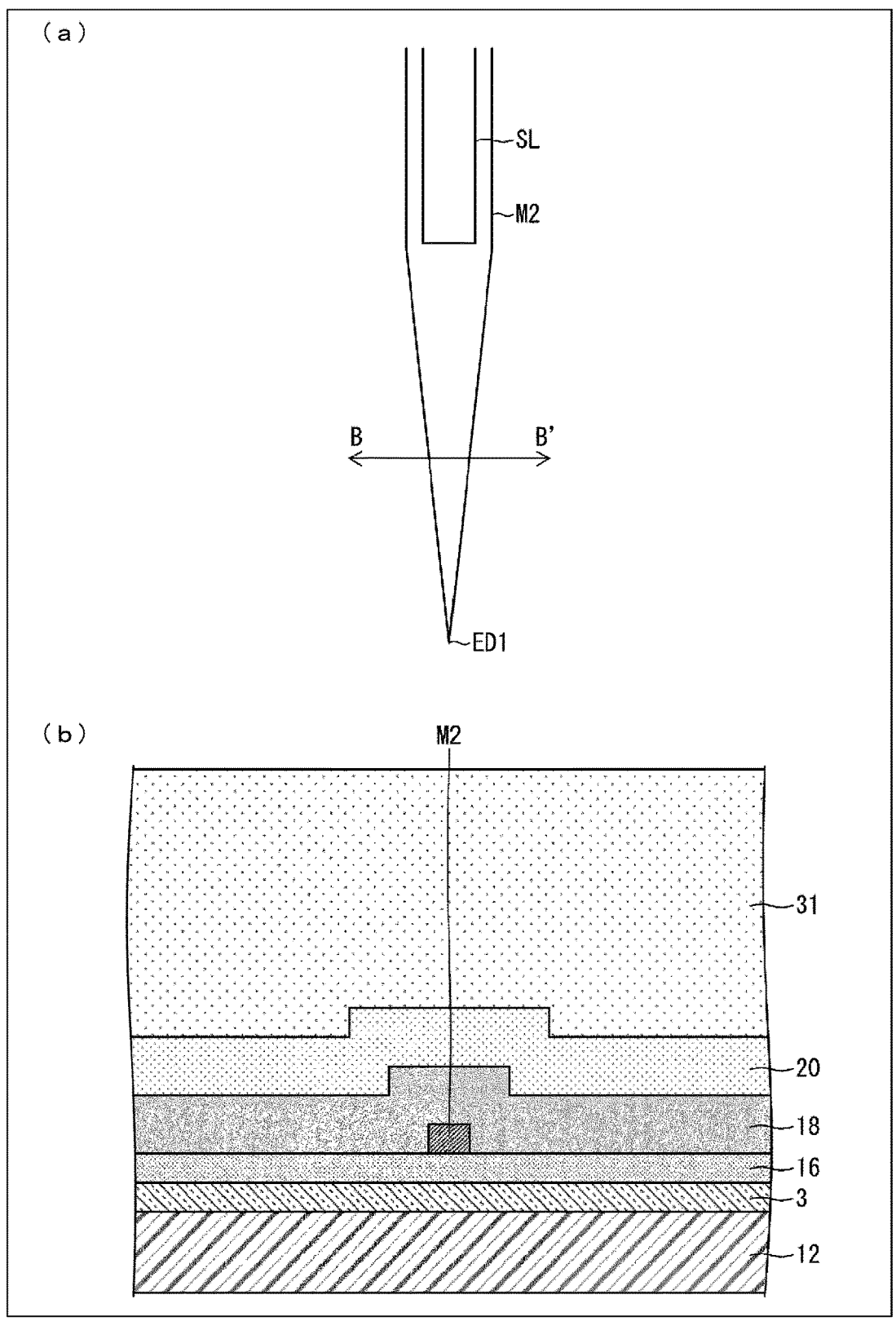
FIG. 8(a) is a partially-enlarged view of a metal pattern.
FIG. 8(b) is a cross-sectional view taken along line B-B' illustrated in FIG. 8(a) and is a cross-sectional view illustrating a schematic configuration of a frame region of a modified example of the first embodiment.

FIG. 7 is a cross-sectional view illustrating a schematic configuration of a frame region NA disposed in a periphery of a curved portion C in a display device 1 of a modified example of the first embodiment. FIG. 8 is a cross-sectional view illustrating a schematic configuration of the frame region NA at or near a metal pattern M2 of the modified example of the first embodiment.

As illustrated in FIG. 7, the metal pattern M2 is in contact with a flattening film 31. The metal pattern M2 is formed right on a gate insulating film 16 in the same layer as a layer forming a first display wiring line GE provided in a display region DA, and a slit SL is formed in each of the first inorganic insulating film 18 and a second inorganic insulating film 20 formed in an upper layer overlying the metal pattern M2. The slit SL is connected to a surface of the metal pattern M2 and exposes the metal pattern M2 to the flattening film 31. The slit SL is provided in each of a first inorganic insulating film 18 and the second inorganic insulating film 20 that cover an end edge ME of the metal pattern. In addition, the metal pattern M2 is formed including the end edge ME that overlaps the first inorganic insulating film 18. The flattening film 31 covers a surface of the second inorganic insulating film 20 and fills the slit SF. Accordingly, the flattening film 31 is in contact with the metal pattern M2 via the slit SL.

Note that, other than the above, a second display wiring line CE may be an initialization power source line, the metal pattern may be formed in the same layer as a layer of the second display wiring line CE, and the metal pattern may be formed with the same material as a material of the second display wiring line CE. In addition, the slit SL may be formed in the second inorganic insulating film 20 formed in an upper layer overlying this metal pattern, and may expose the metal pattern, and the metal pattern may be in contact with the flattening film 31.

Temperature tolerance per unit volume of the flattening film 31 formed with a resin material is much larger than temperature tolerance per unit volume of a metal material. Thus, according to the configuration where the flattening film 31 is in contact with the metal pattern M2, energy propagating via a crack Cra of deformation due to thermal expansion and moisture absorption expansion of the resin layer 12 is released to the flattening film 31, and extension of the crack Cra can be prevented.

In addition, as illustrated in FIG. 8, in the metal pattern M2 having the width tapering toward end portions ED1 and ED2, no slit SF is formed at or near the end portions ED1 and ED2, and both edges in the width direction are in contact with the first inorganic insulating film 18. In the metal pattern M2, one face of each of the end portions ED1 and ED2 is in contact with the base coat film 16, and the other face of each of the end portions ED1 and ED2 is covered with the flattening film 31. Accordingly, at or near the end portions ED1 and ED2, energy of deformation due to a difference in a coefficient of thermal expansion between a portion including the metal pattern M2 and a portion including no metal pattern M2 is released to the flattening film 31, and extension of the crack Cra can be prevented.

Second Embodiment

Figure 9:
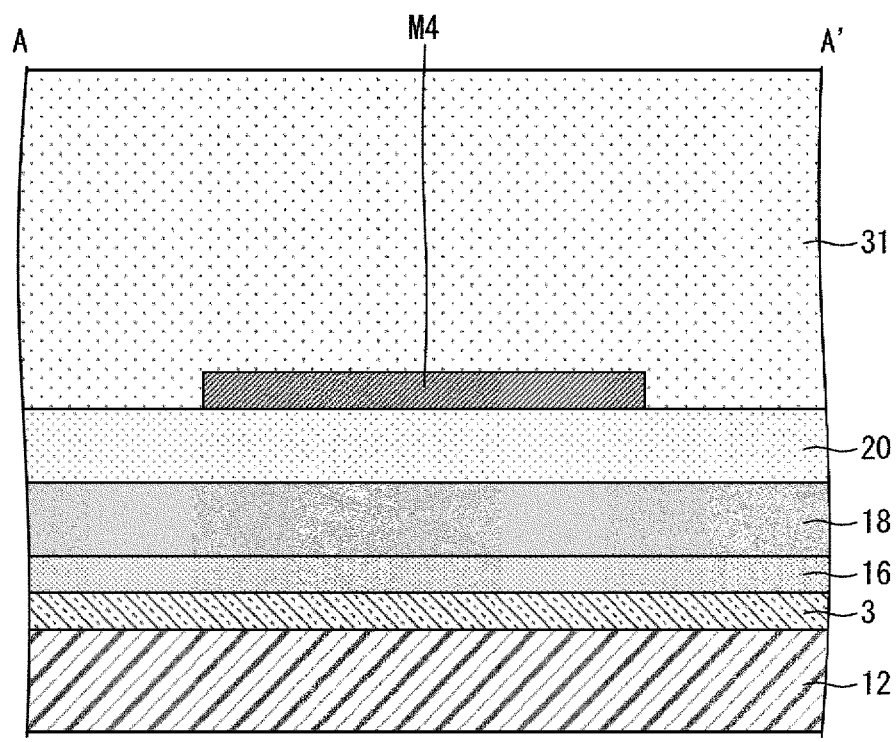
FIG. 9 is a cross-sectional view illustrating a schematic configuration of a frame region disposed in a periphery of a curved portion in a display device of a second embodiment.
Figure 10:
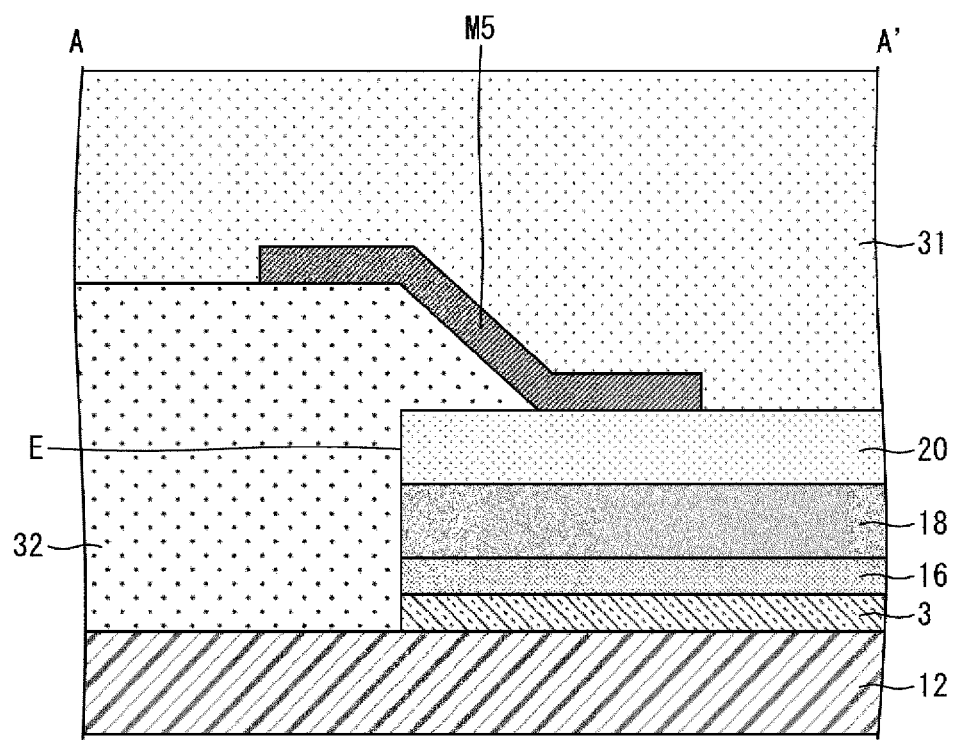
FIG. 10 is a cross-sectional view illustrating a schematic configuration of a frame region disposed in a periphery of a curved portion in a display device of a modified example of the second embodiment.

FIG. 9 is a cross-sectional view illustrating a schematic configuration of a frame region NA disposed in a periphery of a curved portion C in a display device 1 of a second embodiment. FIG. 10 is a cross-sectional view illustrating a schematic configuration of a frame region NA disposed in a periphery of a curved portion C in a display device 1 of a modified example of the second embodiment.

As illustrated in FIG. 9, a metal pattern M4 is formed right on a second inorganic insulating film 20 in the same layer as a layer forming a data signal line that is a third display wiring line SH provided in a display region DA. That is, the metal pattern M4 is interposed between the second inorganic insulating film 20 and a flattening film 31. The metal pattern M4 is formed in the same layer as the layer of the third display wiring line SH, and the metal pattern M4 is formed with the same material as a material of the third display wiring line SH.

In this way, according to the configuration where the metal pattern M4 is formed right on the inorganic insulating film and the metal pattern M4 is in contact with the flattening film 31, energy propagating via a crack Cra of deformation due to thermal expansion or moisture absorption expansion of a resin layer 12 can be released to the flattening film 31, and extension of the crack Cra can be prevented.

Modified Example

As illustrated in FIG. 10, in the display device 1 of the modified example of the second embodiment, a metal pattern M5 is formed in the same layer as a layer forming a third display wiring line SH provided in a display region DA. End portions E of a plurality of inorganic insulating films that include a base coat film 3, a gate insulating film 16, a first inorganic insulating film 18, and a second inorganic insulating film 20 and that are formed in a lower layer of a metal layer forming the metal pattern M5 are formed in the display region DA side (an A' side in the figure) of an edge portion L of the curved portion C. Note that, among the plurality of inorganic insulating films, at least the end portion E of the second inorganic insulating film 20 may be formed in the display region DA side of the edge portion L of the curved portion C.

End portions E of the inorganic insulating films formed in the display region DA side of an end portion of a resin layer 12 is covered with a filling layer 32. For example, the filling layer 32 is formed with a polyimide resin, an epoxy resin, a polyamide resin, or the like. The filling layer 32 may be formed with the same material as a material of a flattening film 31.

In addition, the flattening film 31 may be formed and covers the end portion E of the second inorganic insulating film 20 and a surface of a portion of the second inorganic insulating film 20, and the flattening film 31 may have a function of the filling layer 32. Then, the metal pattern M5 is formed in surfaces of the flattening film 31 and the second inorganic insulating film 20 and strides across the flattening film 31 and the second inorganic insulating film 20.

Figure 11:
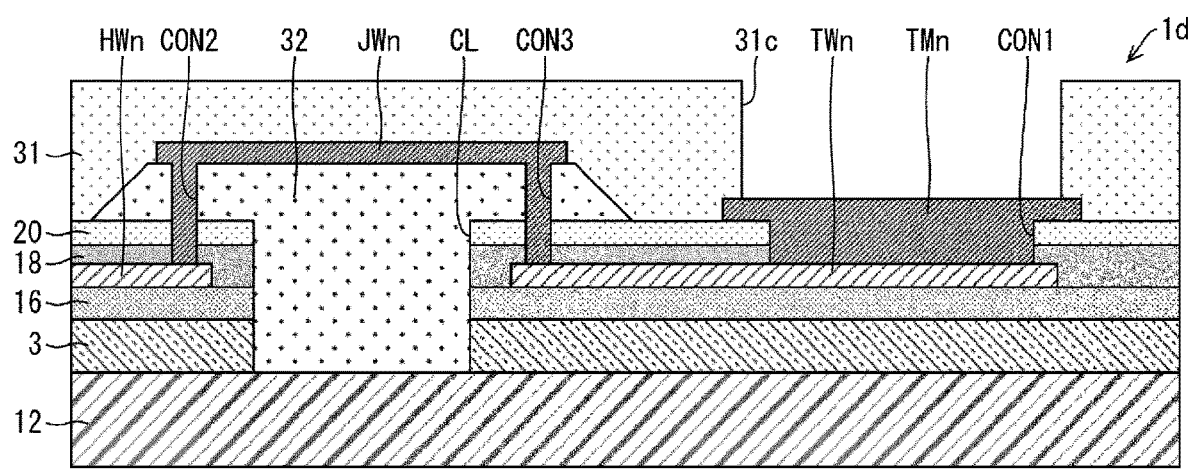
FIG. 11 is a cross-sectional view illustrating a schematic configuration of a bending portion and a terminal portion in the display device of a modified example of the second embodiment.

FIG. 11 is a cross-sectional view illustrating a schematic configuration of a bending portion and a terminal portion in the display device 1 of the modified example of the second embodiment. As illustrated in FIG. 11, in the display device 1, a bending portion CL for bending a display device 1*d* is formed between the display region DA and terminal portions TM1 to TMn outside a second frame-shaped bank 9*b*.

The terminal portions TM1 to TMn are electrically connected to lead wiring lines TW1 to TWn via a plurality of first contact holes CON1, respectively.

The bending portion CL is filled with the filling layer 32 that is a resin layer, and each of conductive members JW1 to JWn is formed in an island shape on the bending portion CL filled with the filling layer 32. The conductive members JW1 to JWn are electrically connected to wiring lines HW1 to HWn from the display region DA via a plurality of second contact holes CON2, respectively and are electrically connected to the lead wiring lines TW1 to TWn via a plurality of third contact holes CON3, respectively.

Note that the flattening film 31 is formed and covers the filling layer 32, each of the conductive members JW1 to JWn, and the second inorganic insulating film 20, and a plurality of openings 31*c* are formed in the flattening film 31 and expose each of the terminal portions TM1 to TMn. The flattening film 31 and the filling layer 32 are formed at the same step.

The display device 1 of the modified example of the second embodiment includes the metal pattern M5 in the frame region NA in the curved portion C, and thus, in this portion, deformation due to thermal expansion and moisture absorption expansion of the resin layer due to a change in ambient humidity and temperature can be suppressed, and significant extension in a film stress releasing direction of a minute crack (or scratch) can be suppressed. Thus, the display device 1 having improved reliability while including the curved portion C having a curved shape can be provided.

Note that each of the metal patterns M1, M2, M4, and M5 is not limited to the configuration where a single layer of the metal pattern is formed, and the metal pattern M1 and the metal pattern M4 may be combined, or the metal pattern M1 and the metal pattern M4 may overlap each other.

Third Embodiment

Figure 12:
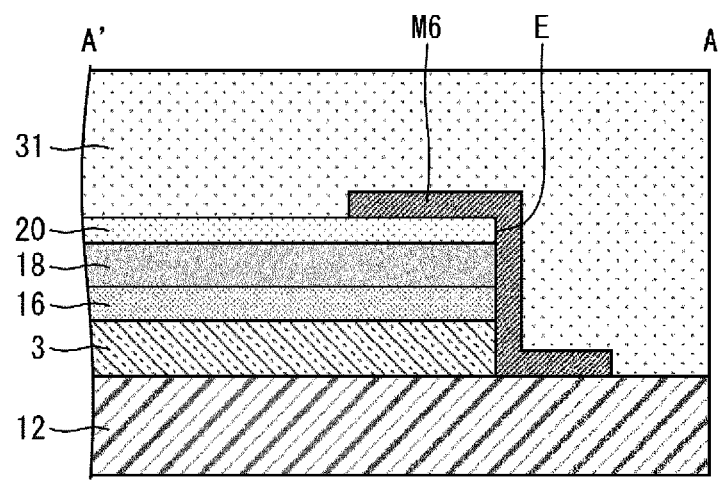
FIG. 12 is a cross-sectional view illustrating a schematic configuration of a frame region disposed in a periphery of a curved portion in a display device of a third embodiment.

Next, a third embodiment of the disclosure will be described with reference to FIG. 12. FIG. 12 is a cross-sectional view illustrating a schematic configuration of a frame region NA disposed in a periphery of a curved portion C in a display device 1 of the third embodiment. In the third embodiment, end portions E of a plurality of inorganic insulating films including a base coat film 3, a gate insulating film 16, a first inorganic insulating film 18, and a second inorganic insulating film 20 are formed in a display region DA side (a left side in the figure) of an edge portion L of the curved portion C. Note that, among the plurality of inorganic insulating films, at least the end portion E of the second inorganic insulating film 20 may be formed in the display region DA side of the edge portion L of the curved portion C.

A metal pattern M6 is formed in surfaces of a resin layer 12 and the second inorganic insulating film 20 and strides across the resin layer 12 and the second inorganic insulating film 20. The metal pattern M6 is formed between the display region DA and the edge portion L of the curved portion C, and more desirably, between a second frame-shaped bank 9b and the edge portion L of the curved portion C. In addition, the metal pattern M6 is formed in the same layer as a layer forming a third display wiring line SH.

In this way, in the display device 1 of the third embodiment, the metal pattern 116 is formed in the surfaces of the resin layer 12 and the second inorganic insulating film 20 and strides across the resin layer 12 and the second inorganic insulating film 20 in the display region DA side of the edge portion L of the curved portion C. In this way, deformation due to thermal expansion and moisture absorption expansion of the resin layer due to a change in ambient humidity and temperature of the curved portion C can be suppressed, and significant extension in a film stress releasing direction of a minute crack (or scratch) can be suppressed. Thus, the display device 1 having improved reliability while including the curved portion C having a curved shape can be provided.

Fourth Embodiment

Figure 13:
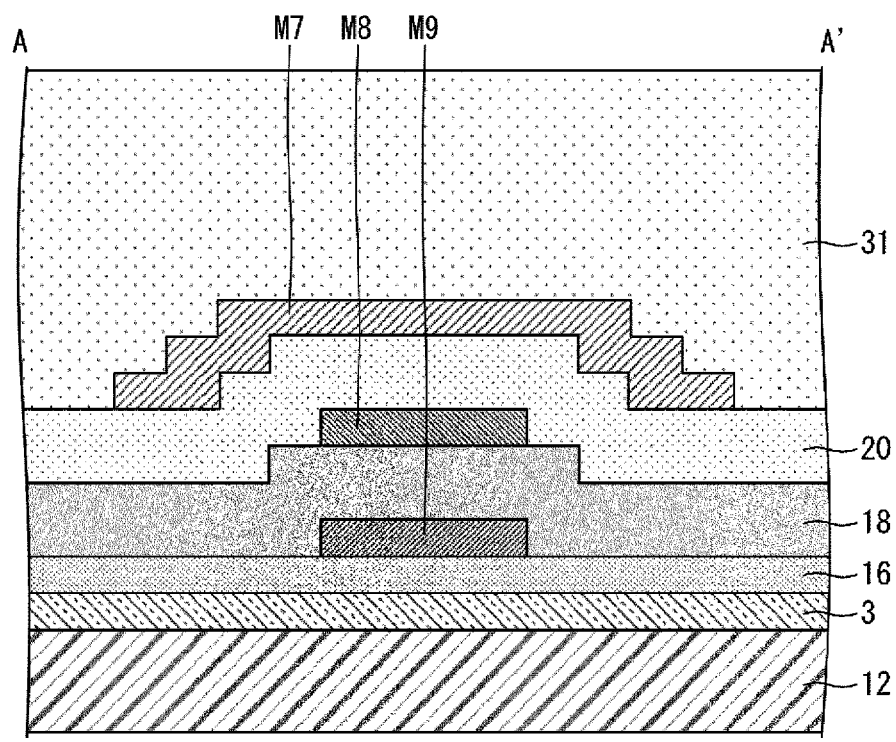
FIG. 13 is a cross-sectional view illustrating a schematic configuration of a frame region disposed in a periphery of a curved portion in a display device of a fourth embodiment.

Next, a fourth embodiment of the disclosure will be described with reference to FIG. 13. FIG. 13 is a cross-sectional view illustrating a schematic configuration of a frame region NA disposed in a periphery of a curved portion C in a display device 1 of the fourth embodiment. In the fourth embodiment, metal patterns M7, M8, and M9 are formed between a second inorganic insulating film 20 and a flattening film 31, between a first inorganic insulating film 18 and the second inorganic insulating film 20, and between a gate insulating film 16 and the first inorganic insulating film 18, respectively.

The metal pattern M7 is formed in the same layer as a layer of a third display wiring line SH formed between the second inorganic insulating film 20 and the flattening film 31. The metal pattern M8 is formed in the same layer as a layer of a second display wiring line CE formed between the first inorganic insulating film 18 and the second inorganic insulating film 20. The metal pattern M9 is formed in the same layer as a layer of a first display wiring line GE formed between the gate insulating film 16 and the first inorganic insulating film 18.

In this way, in the display device 1 of the fourth embodiment, the metal patterns M7, M8, and M9 are formed in the same layers as the layers of the first display wiring line GE, the second display wiring line CE, and the third display wiring line SH, respectively. In this way, the metal pattern is formed right on each inorganic insulating film, and thus, influence of energy propagating via a crack Cra of deformation due to thermal expansion or moisture absorption expansion of the resin layer 12 on the inorganic film can be reduced, and extension of the crack Cra can be prevented.

Fifth Embodiment

Figure 14:
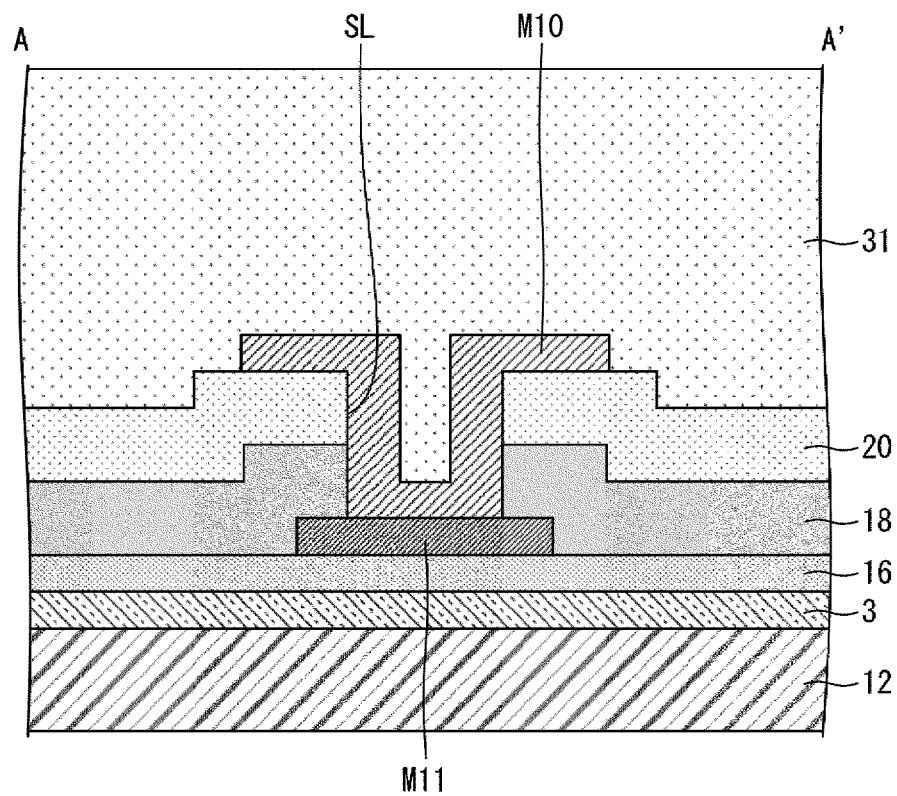
FIG. 14 is a cross-sectional view illustrating a schematic configuration of a frame region disposed in a periphery of a curved portion in a display device of a fifth embodiment.

Next, a fifth embodiment of the disclosure will be described with reference to FIG. 14. FIG. 14 is a cross-sectional view illustrating a schematic configuration of a frame region NA disposed in a periphery of a curved portion C in a display device 1 of the fifth embodiment. In the fifth embodiment, a metal pattern M11 is formed in the same layer as a layer of a first display wiring line GE between a gate insulating film 16 and a first inorganic insulating film 18. A slit SL is formed in each of the first inorganic insulating film 18 and a second inorganic insulating film 20 that are formed in an upper layer overlying the metal pattern M11, and the slit SL exposes the metal pattern M11 to a flattening film 31, and a metal pattern M10 is formed and covers the slit SL. The metal pattern M10 is formed in the same layer as a layer of a third display wiring line SH and is formed with the same material as a material of the third display wiring line SH.

The metal pattern M10 formed in the same layer as the layer of the third display wiring line is in contact with the metal pattern M11 formed in the same layer as the layer of the first display wiring line GE via the slit SL provided in each of the first inorganic insulating film 18 and the second inorganic insulating film 20. In addition, the metal pattern M10 is in contact with the flattening film 31. In this way, the metal pattern M10 is in contact with the metal pattern M11 in a resin layer 12 side, and the flattening film 31 and the resin layer are in contact with each other in an opposite side.

In this way, in the display device 1 of the fifth embodiment, the metal patterns M10 and M11 are formed in contact with the inorganic insulating films 16, 18, and 20, respectively, and thus influence of energy propagating via a crack Cra of deformation due to thermal expansion or moisture absorption expansion of the resin layer 12 on the inorganic film can be reduced, and extension of the crack Cra can be prevented.

Sixth Embodiment

Figure 15:
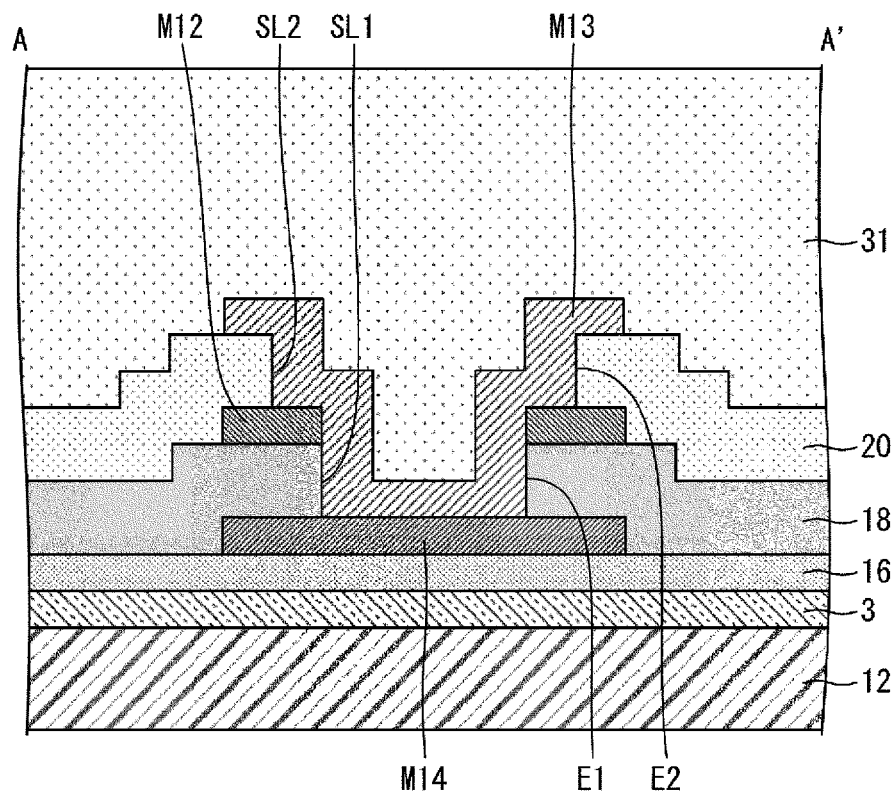
FIG. 15 is a cross-sectional view illustrating a schematic configuration of a frame region disposed in a periphery of a curved portion in a display device of a sixth embodiment.
Figure 16:
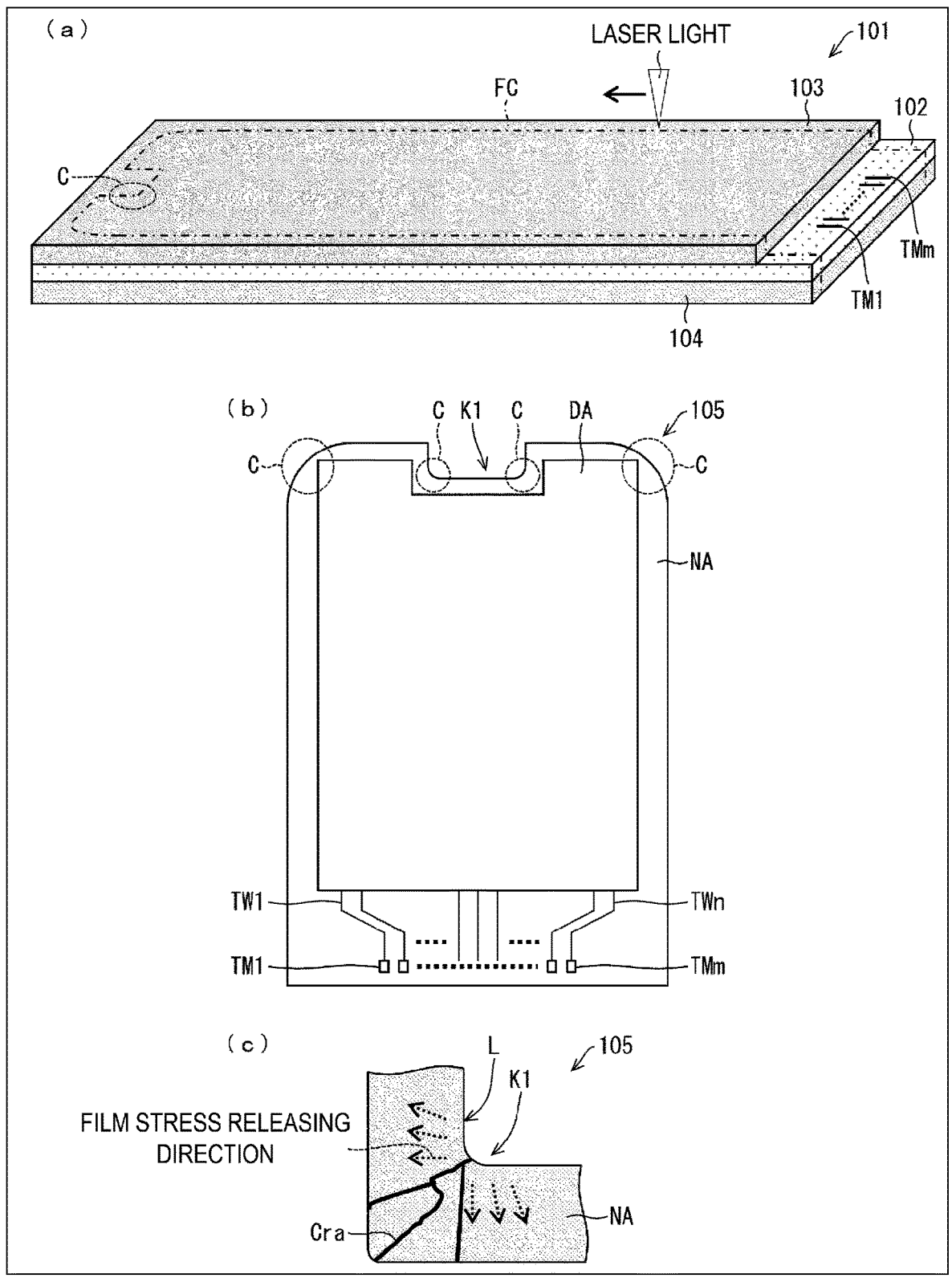
FIG. 16 is an explanatory view of a manufacturing step of a display device of the related art including a curved portion, and problems of the display device of the related art.

Next, a sixth embodiment of the disclosure will be described with reference to FIG. 15. FIG. 15 is a cross-sectional view illustrating a schematic configuration of a frame region NA disposed in a periphery of a curved portion C in a display device 1 of the sixth embodiment. In the sixth embodiment, a metal pattern M13 is formed in the same layer as a layer of a third display wiring line SH formed between a second inorganic insulating film 20 and a flattening film 31 and is formed with the same material as a material of the third display wiring line SH. A metal pattern M12 is formed in the same layer as a layer of a second display wiring line CE formed between a first inorganic insulating film 18 and the second inorganic insulating film 20 and is formed with the same material as a material of the second display wiring line CE. A metal pattern M14 is formed in the same layer as a layer of a first display wiring line GE formed between a gate insulating film 16 and the first inorganic insulating film 18 and is formed with the same material as a material of the first display wiring line GE.

Slits SL1 and SL2 are formed in the first inorganic insulating film 18 and the second inorganic insulating film 20 that are formed in an upper layer overlying the metal pattern M14 formed in the same layer as the layer of the first display wiring line GE, and the slits SL1 and SL2 expose the metal pattern M14 to the flattening film 31. The metal pattern M12 formed in the same layer as the layer of the second display wiring line CE is formed right on the first inorganic insulating film 18 along an edge portion E1 with respect to the slit SL1 of the first inorganic insulating film 18. The slit SL2 of the second inorganic insulating film 20 is provided and exposes the metal pattern M12 to the flattening film 31. The metal pattern M13 formed in the same layer as the layer of the third display wiring line SH is provided and covers the edge portion E1 with respect to the slit SL1 of the first inorganic insulating film 18, an edge portion E2 with respect to the slit SL2 of the second inorganic insulating film 20, and the slit SL1 of the first inorganic insulating film 18 and the slit SL2 of the second inorganic insulating film.

The metal pattern M13 formed in the same layer as the layer of the third display wiring line SH is in contact with the metal pattern M14 formed in the same layer as the layer of the first display wiring line GE in the resin layer 12 side. In addition, the metal pattern M13 is in contact with the metal pattern M12 formed in the same layer as the layer of the second display wiring line CE in the resin layer 12 side and is in contact with the flattening film 31 in a side opposite to the resin layer 12.

In this way, in the display device 1 of the sixth embodiment, the metal patterns M14, M12, and M13 are formed in the same layers as the layers of the first display wiring line GE, the second display wiring line CE, and the third display wiring line SH, respectively, and the metal pattern M13 is in contact with each of the metal pattern M14, the metal pattern M12, and the flattening film 31. In this way, influence of energy propagating via a crack Cra of deformation due to thermal expansion or moisture absorption expansion of the resin layer 12 on the inorganic film can be reduced, and extension of the crack Cra can be prevented.

Supplement

Aspect 1

A display device including a display region, a frame region disposed in a periphery of the display region, and a curved portion having a curved shape and provided at a corner portion at which two sides intersect each other in an outer shape portion of the frame region, wherein the display device includes a resin layer, a plurality of inorganic insulating films formed on the resin layer, and a metal layer formed on and being in contact with one inorganic insulating film of the plurality of inorganic insulating films, a metal pattern formed with the metal layer is formed between an edge portion of the curved portion and the display region in the frame region along a curved shape of the edge portion of the curved portion and along at least a portion of corresponding two sides of the display device, and the metal pattern is electrically disconnected from a wiring line of the display region, and a width of the metal pattern decreases toward both end portions.

Aspect 2

The display device according to aspect 1, wherein the metal pattern M includes an end portion in a linear portion of each of the two sides in the frame region.

Aspect 3

The display device according to aspect 1 or 2, wherein a base coat film, a first inorganic insulating film, and a second inorganic insulating film provided in the plurality of inorganic insulating films are layered in that order on the resin layer, a plurality of first display wiring lines, a plurality of second display wiring lines, and a plurality of third display wiring lines are formed in the display region, the plurality of first display wiring lines are formed between the base coat film and the first inorganic insulating film, the plurality of second display wiring lines are formed between the first inorganic insulating film and the second inorganic insulating film, the plurality of third display wiring lines are formed between the second inorganic insulating film and a flattening film, and the metal pattern is formed with at least any one layer of metal layers formed in the same layers and with the same material as layers and materials of the plurality of first display wiring lines, the plurality of second display wiring lines, and the plurality of third display wiring lines.

Aspect 4

The display device according to aspect 3, wherein the plurality of first display wiring lines are scanning signal lines, the metal pattern is formed in the same layer as the layer of the plurality of first display wiring lines, and the metal pattern is formed with the same material as the material of the plurality of first display wiring lines.

Aspect 5

The display device according to aspect 3 or 4, wherein the plurality of second display wiring lines are initialization power source lines, the metal pattern is formed in the same layer as the layer of the plurality of second display wiring lines, and the metal pattern is formed with the same material as the material of the plurality of second display wiring lines.

Aspect 6

The display device according to any one of aspects 3 to 5, wherein the plurality of third display wiring lines are data signal lines, the metal pattern is formed in the same layer as the layer of the plurality of third display wiring lines, and the metal pattern is formed with the same material as the material of the plurality of third display wiring lines.

Aspect 7

The display device according to any one of aspects 3 to 6, wherein a slit is formed in each of the first inorganic insulating film and the second inorganic insulating film that are formed in an upper layer overlying the metal pattern, and the slit exposes the metal pattern, and the metal pattern is in contact with the flattening film.

Aspect 8

The display device according to aspect 7, wherein the slit is provided in each of the first inorganic insulating film and the second inorganic insulating film that cover the end portion of the metal pattern.

Aspect 9

The display device according to aspect 8, wherein an end edge of the metal pattern overlaps the first inorganic insulating film.

Aspect 10

The display device according to any one of aspects 3 to 6, wherein a slit is formed in the second inorganic insulating film formed in an upper layer overlying the metal pattern, and the slit exposes the metal pattern, and the metal pattern is in contact with the flattening film.

Aspect 11

The display device according to any one of aspects 3 to 6, wherein, in the frame region disposed in a periphery of the curved portion, an end portion of at least the second inorganic insulating film among the plurality of inorganic insulating films is formed in the display region side of the edge portion of the curved portion, the flattening film is formed and covers the end portion of the second inorganic insulating film and a surface of a portion of the second inorganic insulating film, and the metal pattern is formed in surfaces of the flattening film and the second inorganic insulating film and strides across the flattening film and the second inorganic insulating film.

Aspect 12

The display device according to any one of aspects 3 to 6, wherein, in the frame region disposed in a periphery of the curved portion, an end portion of at least the second inorganic insulating film among the plurality of inorganic insulating films is formed in the display region side of the edge portion of the curved portion, and the metal pattern is formed in surfaces of the resin layer and the second inorganic insulating film and strides across the resin layer and the second inorganic insulating film.

Aspect 13

The display device according to any one of aspects 3 to 6, wherein the metal pattern is formed in the same layer as the layers of the plurality of first display wiring lines, the plurality of second display wiring lines, and the plurality of third display wiring lines.

Aspect 14

The display device according to any one of aspects 3 to 6, wherein a slit is formed in each of the first inorganic insulating film and the second inorganic insulating film that are formed in an upper layer overlying the metal pattern, and the slit exposes the metal pattern, the metal pattern formed in the same layer as the layer of the plurality of third display wiring lines and formed with the same material as the material of the plurality of third display wiring lines is provided and covers the slit, and the metal pattern in the same layer as the layer of the plurality of third display wiring lines is in contact with the metal pattern formed in the same layer as the layer of the plurality of first display wiring lines in the resin layer side, and is in contact with the flattening film in a side opposite to the resin layer.

Aspect 15

The display device according to any one of aspects 3 to 6, wherein a slit is formed in each of the first inorganic insulating film and the second inorganic insulating film that are formed in an upper layer overlying the metal pattern, and the slit exposes the metal pattern, the metal pattern formed in the same layer as the layer of the plurality of second display wiring lines on the first inorganic insulating film along the slit of the first inorganic insulating film and formed with the same material as the material of the plurality of second display wiring lines is provided, the slit of the second inorganic insulating film is provided and exposes the metal pattern formed in the same layer as the layer of the plurality of second display wiring lines, the metal pattern formed in the same layer as the layer of the plurality of third display wiring lines and formed with the same material as the material of the plurality of third display wiring lines is provided and covers the slit of the first inorganic insulating film and the slit of the second inorganic insulating film, and the metal pattern formed in the same layer as the layer of the plurality of third display wiring lines is in contact with the metal pattern formed in the same layer as the layer of the plurality of first display wiring lines in the resin layer side, and is in contact with the metal pattern formed in the same layer as the layer of the plurality of second display wiring lines in the resin layer side, and is in contact with the flattening film in a side opposite to the resin layer.

Aspect 16

The display device according to any one of aspects 1 to 15, wherein, in the frame region, a projection is formed and surrounds the display region, and the metal pattern is formed between the projection and the edge portion of the curved portion.

Aspect 17

The display device according to aspect 16, wherein the projection includes a first projection surrounding the display region and a second projection surrounding the first projection, and the metal pattern is formed between the second projection and the edge portion of the curved portion.

Aspect 18

The display device according to any one of aspects 1 to 17, wherein the resin layer is a polyimide resin layer.

Aspect 19

A method for manufacturing a display device including a display region, a frame region disposed in a periphery of the display region, and a curved portion having a curved shape and provided at a corner portion at which two sides intersect each other in an outer shape portion of the frame region, the method including the steps of forming a resin layer, forming a plurality of inorganic insulating films on the resin layer, forming a metal layer formed on and being in contact with one inorganic insulating film of the plurality of inorganic insulating films, and forming a metal pattern by patterning the metal layer between an edge portion of the curved portion and the display region in the frame region along a curved shape of the edge portion of the curved portion and along at least a portion of corresponding two sides of the display device, wherein the metal pattern is electrically disconnected from a wiring line of the display region and is formed having a width of the metal pattern decreasing toward both end portions.

Additional Items

The disclosure is not limited to each of the embodiments described above, and various modifications can be made within the scope of the claims. An embodiment obtained by appropriately combining the technical approaches disclosed in each of the different embodiments also falls within the technical scope of the disclosure. Further, a novel technical feature can be formed by combining the technical approaches disclosed in each of the embodiments.

Other Display

In each of the first embodiment to the third embodiment, the example of application to an organic electroluminescence (EL) display panel including an organic light emitting diode (OLED) is described, but the application is not particularly limited as long as the display panel is a display panel including a display element. The display element is a display element having luminance and transmittance controlled by a current, and can be applied to, for example, a quantum dot light emitting diode (QLED) display Or the like including an EL display QLED, such as an inorganic EL display including an inorganic light emitting diode.

The invention claimed is:

1. A display device comprising:
a display region;
a frame region disposed in a periphery of the display region; and
a curved portion having a curved shape and provided at a corner portion at which two sides of the frame region intersect each other in an outer shape portion of the frame region,
wherein the display device further comprises a resin layer, a plurality of inorganic insulating films formed on the resin layer, and a metal layer formed on and being in contact with one inorganic insulating film of the plurality of inorganic insulating films,
a metal pattern formed with the metal layer is formed between an edge portion of the curved portion and the display region, in the frame region along a curved shape of the edge portion of the curved portion, and along at least a portion of two corresponding sides of the display device,
the metal pattern is electrically disconnected from a wiring line of the display region, and a width of the metal pattern decreases toward both end portions of the metal pattern,
a base coat film, a first inorganic insulating film, and a second inorganic insulating film provided in the plurality of inorganic insulating films are layered in that order on the resin layer,
a plurality of first display wiring lines, a plurality of second display wiring lines, and a plurality of third display wiring lines are formed in the display region,
the plurality of first display wiring lines is formed between the base coat film and the first inorganic insulating film,
the plurality of second display wiring lines is formed between the first inorganic insulating film and the second inorganic insulating film, the plurality of third display wiring lines is formed between the second inorganic insulating film and a flattening film, the metal pattern is formed with at least one of a plurality of metal layers, including the metal layer, that is formed in the same layer and with the same material as layers and materials of the plurality of first display wiring lines, the plurality of second display wiring lines, and the plurality of third display wiring lines the plurality of second display wiring lines is initialization power source lines, the metal pattern is formed in the same layer as the layer of the plurality of second display wiring lines, and the metal pattern is formed with the same material as the material of the plurality of second display wiring lines.

2. The display device according to claim 1,
wherein each of the both end portions of the metal pattern is in a linear portion of a corresponding side of the two sides in the frame region.

3. The display device according to claim 1,
wherein the metal pattern is formed in the same layer as the layers of the plurality of first display wiring lines, the plurality of second display wiring lines, and the plurality of third display wiring lines.

4. The display device according to claim 1,
wherein, in the frame region, a projection is formed and surrounds the display region, and
the metal pattern is formed between the projection and the edge portion of the curved portion.

5. The display device according to claim 4,
wherein the projection includes a first projection surrounding the display region and a second projection surrounding the first projection, and
the metal pattern is formed between the second projection and the edge portion of the curved portion.

6. The display device according to claim 1,
wherein the resin layer is a polyimide resin layer.

7. A display device comprising:
a display region;
a frame region disposed in a periphery of the display region; and
a curved portion having a curved shape and provided at a corner portion at which two sides of the frame region intersect each other in an outer shape portion of the frame region,
wherein the display device further comprises a resin layer, a plurality of inorganic insulating films formed on the resin layer, and a metal layer formed on and being in contact with one inorganic insulating film of the plurality of inorganic insulating films,
a metal pattern formed with the metal layer is formed between an edge portion of the curved portion and the display region, in the frame region along a curved shape of the edge portion of the curved portion, and along at least a portion of two corresponding sides of the display device,
the metal pattern is electrically disconnected from a wiring line of the display region, and a width of the metal pattern decreases toward both end portions of the metal pattern,
a base coat film, a first inorganic insulating film, and a second inorganic insulating film provided in the plurality of inorganic insulating films are layered in that order on the resin layer,
a plurality of first display wiring lines, a plurality of second display wiring lines, and a plurality of third display wiring lines are formed in the display region,
the plurality of first display wiring lines is formed between the base coat film and the first inorganic insulating film,
the plurality of second display wiring lines is formed between the first inorganic insulating film and the second inorganic insulating film,
the plurality of third display wiring lines is formed between the second inorganic insulating film and a flattening film,
the metal pattern is formed with at least one of a plurality of metal layers, including the metal layer, that is formed in the same layer and with the same material as layers and materials of the plurality of first display wiring lines, the plurality of second display wiring lines, and the plurality of third display wiring lines,
the plurality of third display wiring lines is data signal lines,
the metal pattern is formed in the same layer as the layer of the plurality of third display wiring lines, and
the metal pattern is formed with the same material as the material of the plurality of third display wiring lines.

8. A display device comprising:
a display region;
a frame region disposed in a periphery of the display region; and
a curved portion having a curved shape and provided at a corner portion at which two sides of the frame region intersect each other in an outer shape portion of the frame region,
wherein the display device further comprises a resin layer, a plurality of inorganic insulating films formed on the resin layer, and a metal layer formed on and being in contact with one inorganic insulating film of the plurality of inorganic insulating films,
a metal pattern formed with the metal layer is formed between an edge portion of the curved portion and the display region, in the frame region along a curved shape of the edge portion of the curved portion, and along at least a portion of two corresponding sides of the display device,
the metal pattern is electrically disconnected from a wiring line of the display region, and a width of the metal pattern decreases toward both end portions of the metal pattern
a base coat film, a first inorganic insulating film, and a second inorganic insulating film provided in the plurality of inorganic insulating films are layered in that order on the resin layer,
a plurality of first display wiring lines, a plurality of second display wiring lines, and a plurality of third display wiring lines are formed in the display region,
the plurality of first display wiring lines is formed between the base coat film and the first inorganic insulating film,
the plurality of second display wiring lines is formed between the first inorganic insulating film and the second inorganic insulating film,
the plurality of third display wiring lines is formed between the second inorganic insulating film and a flattening film,
the metal pattern is formed with at least one of a plurality of metal layers, including the metal layer, that is formed in the same layer and with the same material as layers and materials of the plurality of first display wiring lines, the plurality of second display wiring lines, and the plurality of third display wiring lines, a slit is formed in the second inorganic insulating film in an upper layer overlying the metal pattern, the slit exposes the metal pattern, and the metal pattern is in contact with the flattening film.

9. The display device according to claim 8, wherein a slit is formed in each of the first inorganic insulating film and the second inorganic insulating film that are formed in an upper layer overlying the metal pattern, and the slit exposes the metal pattern.

10. The display device according to claim 9, wherein the slit is provided in each of the first inorganic insulating film and the second inorganic insulating film that cover one of the both end portions of the metal pattern.

11. The display device according to claim 10, wherein an end edge of the metal pattern overlaps the first inorganic insulating film.

12. The display device according to claim 8, wherein the plurality of first display wiring lines is scanning signal lines, the metal pattern is formed in the same layer as the layer of the plurality of first display wiring lines, and the metal pattern is formed with the same material as the material of the plurality of first display wiring lines.

13. The display device according to claim 8, wherein the plurality of second display wiring lines is initialization power source lines, the metal pattern is formed in the same layer as the layer of the plurality of second display wiring lines, and the metal pattern is formed with the same material as the material of the plurality of second display wiring lines.

14. The display device according to claim 8, wherein the plurality of third display wiring lines is data signal lines, the metal pattern is formed in the same layer as the layer of the plurality of third display wiring lines, and the metal pattern is formed with the same material as the material of the plurality of third display wiring lines.

* * * * *